(12) United States Patent
Foster, Sr. et al.

(10) Patent No.: US 7,038,911 B2
(45) Date of Patent: May 2, 2006

(54) PUSH-PULL DUAL FAN FANSINK

(75) Inventors: Jimmy Grant Foster, Sr., Morrisville, NC (US); Michael Sean June, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 10/881,358

(22) Filed: Jun. 30, 2004

(65) Prior Publication Data

US 2006/0002085 A1    Jan. 5, 2006

(51) Int. Cl.
*H05K 7/20* (2006.01)

(52) U.S. Cl. .............. 361/695; 361/697; 361/703; 257/722; 165/80.3; 165/185; 174/16.3

(58) Field of Classification Search .............. 361/694, 361/695, 697, 703; 257/721, 722; 174/16.3; 165/80.3, 185

See application file for complete search history.

(56) References Cited

U.S. PATENT DOCUMENTS

| 5,787,971 | A | 8/1998 | Dodson |
| 6,501,651 | B1 | 12/2002 | Lin et al. |
| 6,512,673 | B1 | 1/2003 | Wiley |
| 6,668,910 | B1 * | 12/2003 | Gawve ................. 165/80.3 |
| 6,691,768 | B1 * | 2/2004 | Hsieh et al. ............ 165/80.3 |
| 6,816,373 | B1 * | 11/2004 | Lee et al. ............... 361/697 |
| 2003/0128513 | A1 | 7/2003 | Wiley |
| 2003/0168208 | A1 * | 9/2003 | Sato ..................... 165/122 |
| 2004/0031589 | A1 * | 2/2004 | Lin ...................... 165/80.3 |
| 2005/0082034 | A1 * | 4/2005 | Hwang et al. ........... 165/80.3 |

FOREIGN PATENT DOCUMENTS

JP    9307034 A    11/1997

* cited by examiner

*Primary Examiner*—Boris Chervinsky
(74) *Attorney, Agent, or Firm*—Martin J. McKinley; Dillon & Yudell LLP

(57) ABSTRACT

A heat sink having an air flow director on each of multiple fins attached to a heat sink base. The air flow directors direct most of the air flow from dual push-pull fans towards a midline and a geometric center of the heat sink base, which is above the hottest part of the integrated circuit (IC) package being cooled by the heat sink. The rest of the air flow from the push-pull fans impinges against the air flow directors, providing additional cooling to the fins.

9 Claims, 4 Drawing Sheets

PUSH-PULL DUAL FAN FANSINK

BACKGROUND OF THE INVENTION

1. Technical Field

The present invention relates in general to the field of electronics, and in particular to electronic chips that generate extraneous heat during normal operation. More particularly, the present invention relates to a method and system for conducting heat away from an integrated circuit, which still more particularly may be a microprocessor.

2. Description of the Related Art

In a typical personal computer (PC), the main heat-generating component among the logic circuits is the processor, also referred to as the Central Processing Unit (CPU) or microprocessor (MP). As illustrated in FIG. 1a, a processor 102 is mounted in a socket 104, which is mounted on a (printed) circuit board 106 by mating pins 108 from the processor 102 into the socket 104. As processors continue to grow in performance, so does the heat generated by the processors. To remove heat from processor 102, a heat sink (HS) 110, having a HS base 112 and a plurality of fins 114, is secured to processor 102 by a strap 116 or other attachment means. Heat is conducted from the processor 102 to the HS base 112 and the fins 114, which dissipate heat by conduction and convection to ambient air surrounding fins 114. To provide thermal conduction between a top surface 120 of processor 102 and the HS base 112, thermal grease 118, typically a thermally conductive silicon or filled hydrocarbon grease doped with fillings such as metals, is used.

A major problem with the heat sink 110 shown in FIG. 1a is that it relies on conduction to the ambient air, which may or may not be moving enough to significantly convey away heat from the fins, depending on movement of air about the heat sink caused by fan(s) in a computer case that houses the processor 102. To aid in this air movement, a heat sink fan 122, as shown in FIG. 1b, is often used. Heat sink fan 122 includes fan blades 124 that rotate about a hub 126. Thus, there is a "dead space" below hub 126 in which there is minimal air movement. This is especially problematic since it is typically the center of processor 102 that generates the most heat. Thus, the area of processor 102 and its adjacent HS base 112 that needs the most cooling actually receives the least amount of help from heat sink fan 122.

What is needed therefore is a device that provides maximum cooling to the center portion of processor 102 and HS base 112.

SUMMARY OF THE INVENTION

The present invention is therefore directed to a heat sink having an air flow director on each of multiple fins attached to a heat sink base. The air flow directors direct most of the air flow from dual push-pull fans towards a midline and a geometric center of the heat sink base, which is above the hottest part of the integrated circuit (IC) package being cooled by the heat sink. The rest of the air flow from the push-pull fans impinges against the air flow directors, providing additional cooling to the fins.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF A PREFERRED EMBODIMENT

Figure 2A:
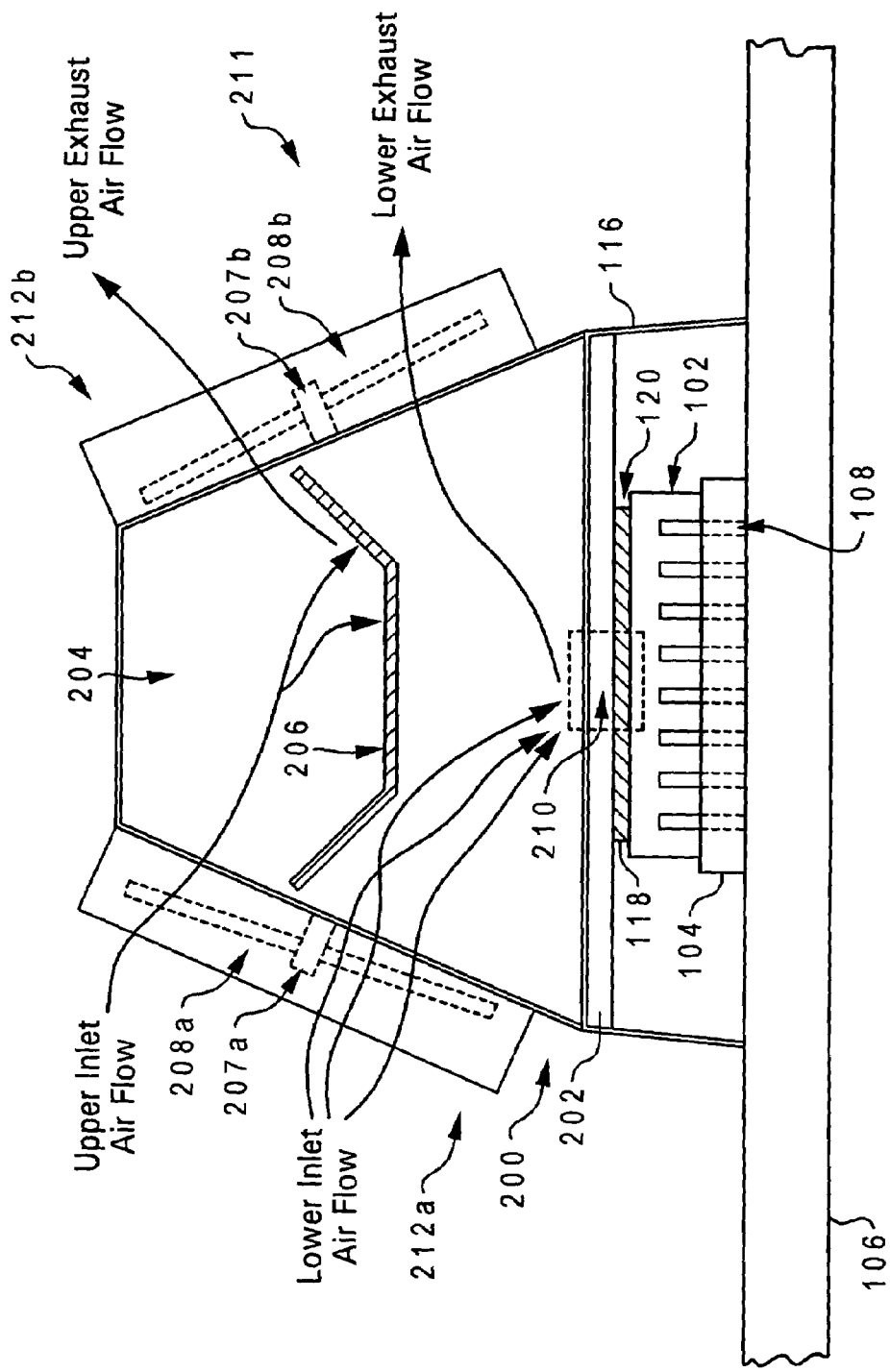
FIGS. 2a–b depicts the inventive heat sink having air flow directors on heat sink fins.

With reference now to FIG. 2a, there is depicted a novel baffled heat sink 200. Baffled heat sink 200 is composed of a base 202, to which multiple baffled fins 204 are mounted, preferably being mounted normal (perpendicular) to the top of base 202. Each baffled fin 204 includes an air flow director 206, which is preferably a single air flow director 206. Air flow directors 206 can be stamped out of baffled fins 204, or air flow directors 206 can be manufactured separately and attached to unstamped fins, resulting in no voids in the baffled fins 204 from the stamping process.

Figure 1A:
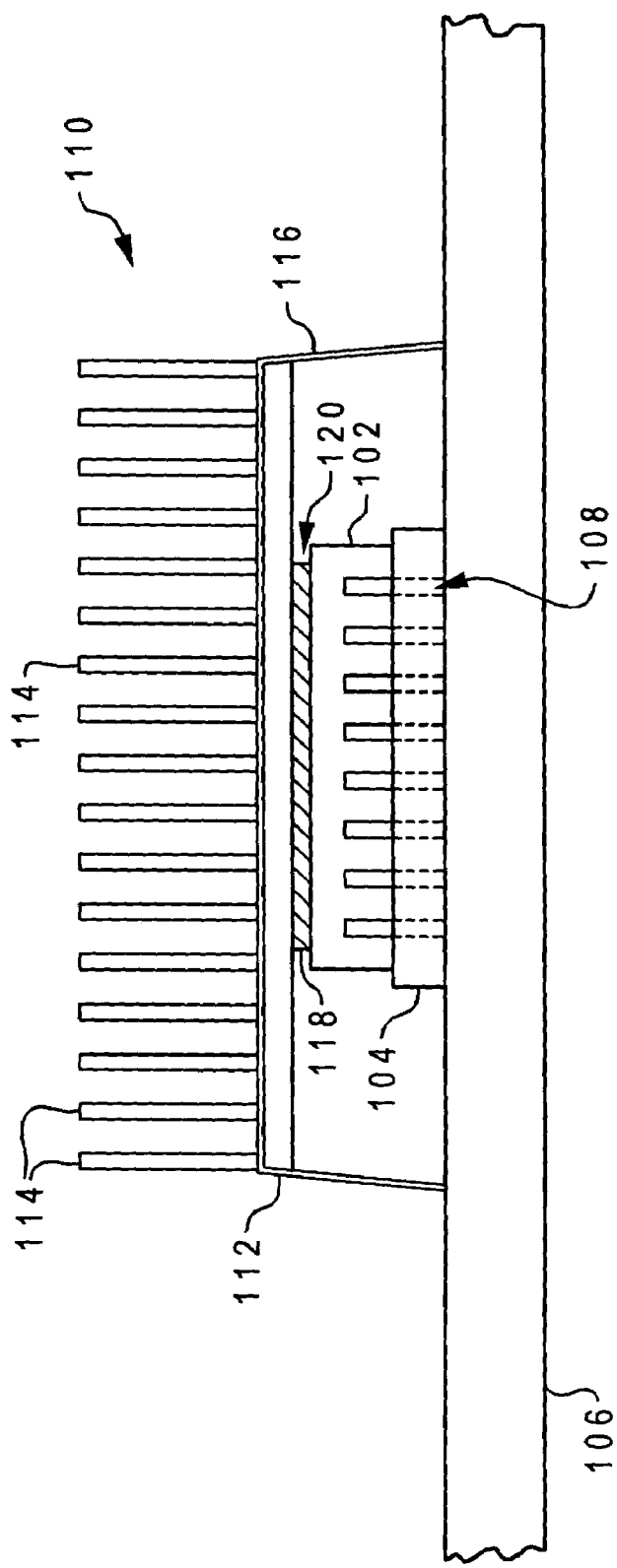
FIG. 1a depicts a prior art heat sink mounted against an integrated circuit (IC) chip package.
Figure 1B:
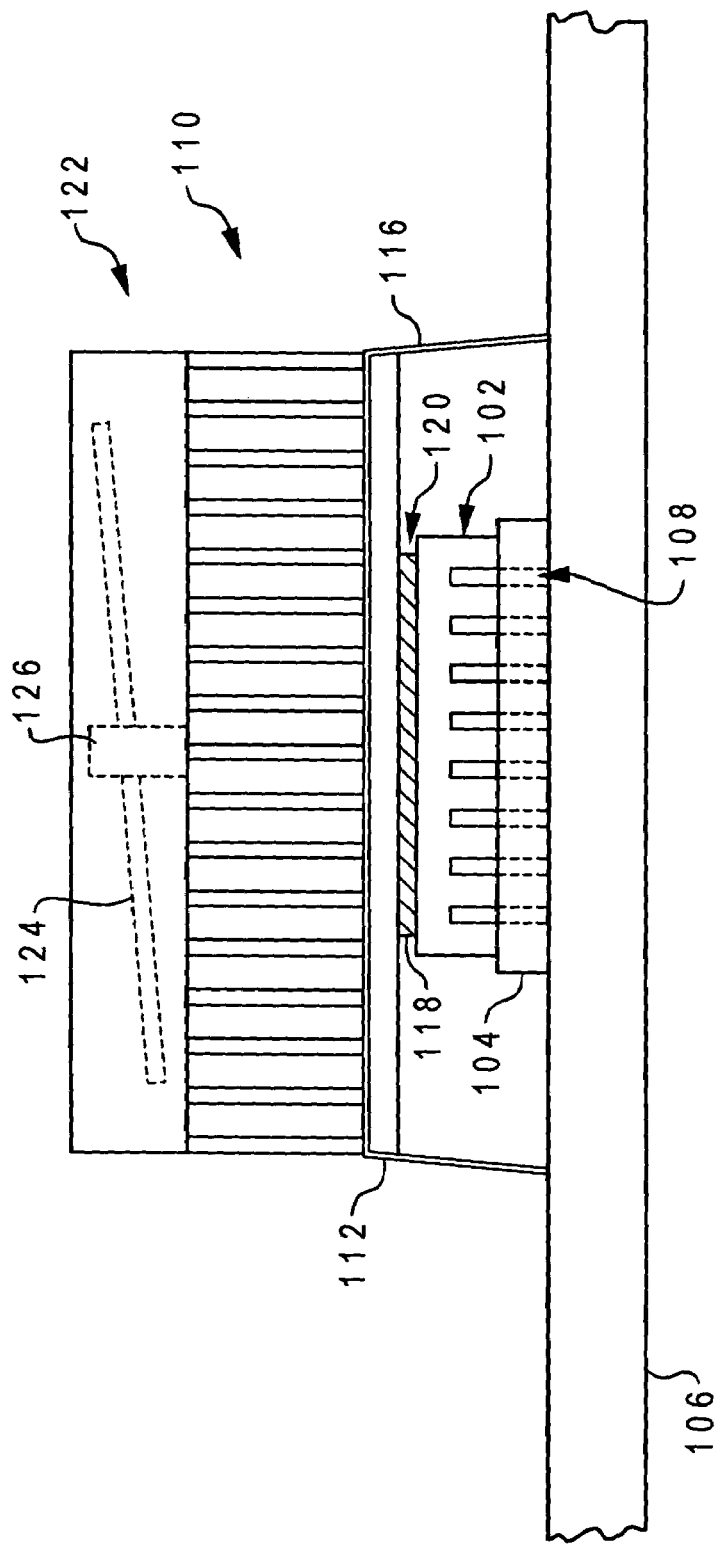
FIG. 1b illustrates the prior art heat sink with a conventional heat sink fan.

Baffled heat sink 200 is secured above and against processor 102 in any manner known to those skilled in the art of heat sinks, including the manner described above for FIG. 1a, and will not be reiterated here.

Mounted on opposing sides of baffled heat sink 200 are a pair of push-pull fans, identified in FIG. 2a as an inlet fan 212a and an outlet fan 212b, each fan 212 have fan blades 208 to generate air movement. Baffled heat sink 200 combined with the push-pull fans 212 form a fansink 211. Note that base 202 is oriented above a "hot spot" 210 caused by processor 102, and more specifically the center of processor 102, where most of the heat from processor 102 is generated. This hot spot 210 causes an area of base 202, preferably a geometric center of base 202, to be located in a position where a maximum amount of air from inlet fan 212a is directed against hot spot 210 with the aid of air flow directors 206.

As shown in FIG. 2a, inlet fan 212a generates an upper inlet air flow and a lower inlet air flow. The lower inlet air flow is greater than the upper inlet air flow, as the lower inlet air flow is composed of air flow generated by fan 208a both above and below a hub 207a. That is, the lower inlet air flow is made up of all of the air flow from below hub 207a as well a part of the air flow generated above hub 207a. This lower inlet air flow is defined as the total amount of air that is directed towards hot spot 210 by air flow directors 206.

The inlet fan 212a also generates an upper inlet air flow, which is defined as the remaining air flow generated by fan 208a that is not directed towards hot spot 210. The upper inlet air flow, although less than the lower inlet air flow, still provides an increased amount of cooling over the prior art that does not have the described air flow directors on the fins. This increased cooling is supplied to the fins themselves by the impingement action of the upper inlet air flow against the air flow directors 206. As is known and understood by those skilled in the art of thermodynamics, direct air flow against a surface provides an increased level of cooling of that surface. Thus, the upper inlet air flow that impinges against the air flow directors 206 provides an increased level of cooling to the air flow directors 206 and the baffled fins 204 to which they are attached.

Figure 2B:
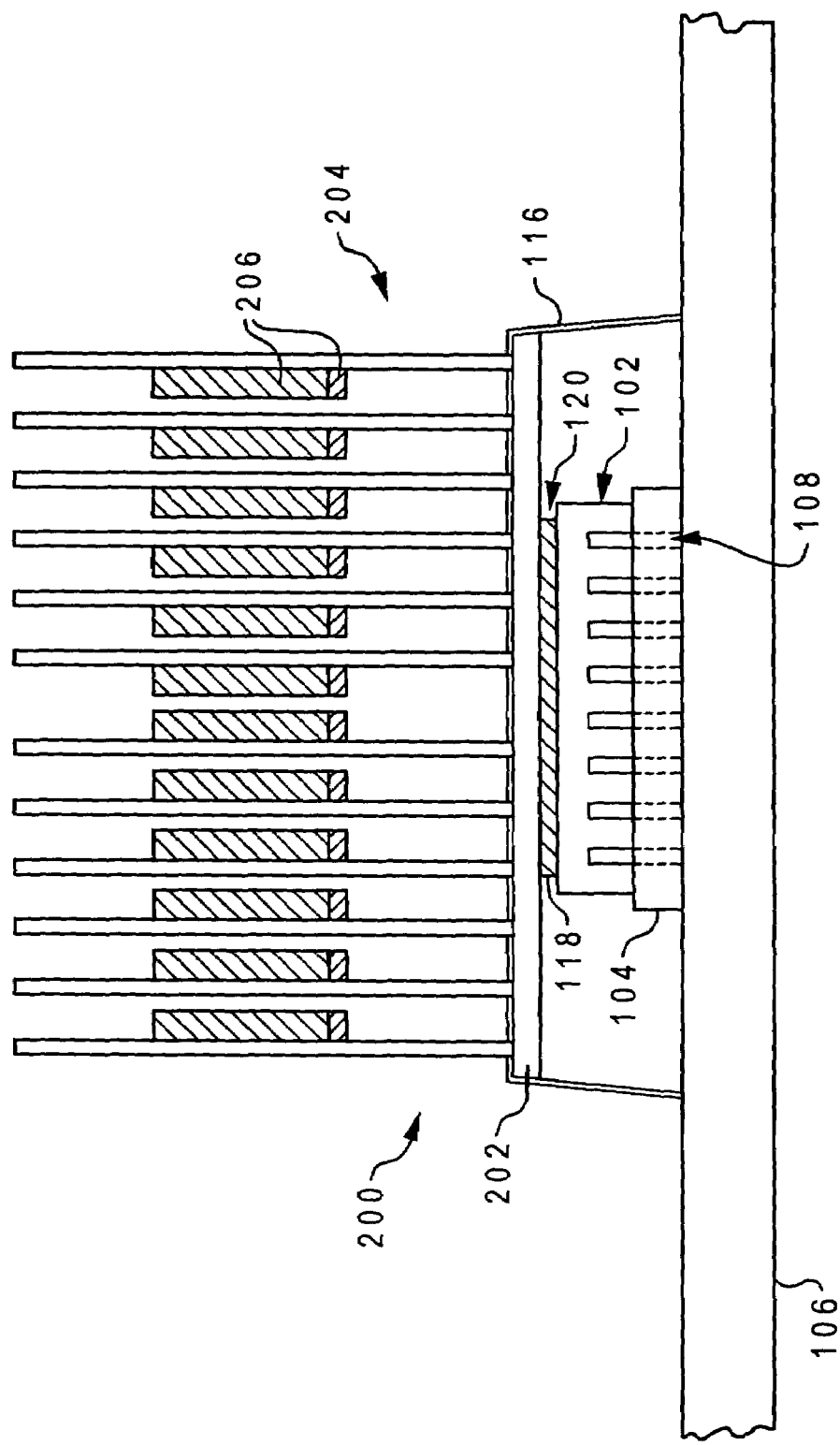

FIG. 2b illustrates baffled fins 204 with the push-pull fans 212 removed for clarity of illustration. Note that the air flow directors 206 nearly occlude the space between the baffled fins 204, thus capturing and providing maximum air flow towards hot spot 210 shown in FIG. 2a.

Having dual push-pull heat sink fans 212 provides several benefits. First, the push-pull relationship improves laminar air flow. Second, by having two fans instead of one fan, the two fans are able to operate at a lower speed (RPM) than a single fan, thus reducing the amount of vibration and noise created by the two fans. Third, the two fans allows one of the heat sink fans 212a to be a backup to the other heat sink fan 212b, in case heat sink fan 212a should fail. Fourth, heat sink fan 212b may optionally be turned on only if heat sink fan 212a is unable to provide adequate cooling of processor 102, as determined and measured by any technique known to those skilled in the art of processor temperature control. Note that the third and fourth benefits do not have the benefit of a push-pull relationship provided by two fans, but the air flow described above with regards to air flow directors 206 is still effective, particularly if the inlet fan 212a is the single operational fan.

The present invention therefore provides a quiet and efficient method of removing heat from an IC chip by directing air flow to the hot spot where the air is needed the most. The system results in a minimal reduction in pressure drop and increased air flow across the hot spot, while providing additional cooling of the fins themselves.

While the invention has been particularly shown and described with reference to a preferred embodiment, it will be understood by those skilled in the art that various changes in form and detail may be made therein without departing from the spirit and scope of the invention. For example, while the present invention has been described in removing heat from a processor, the inventive heat sink and fansink are useful in removing heat from any heat generating device, and particularly any heat generating integrated circuit package.

Note that while the air flow directors have been described as being single units on one side of the fins, alternatively the fins may have one or more air flow directors on one or both sides of the fins.

While terms such as "above" and "beneath" have been used to describe the spatial orientation and movement of different components, such terms are used generically, and the present invention as described and claimed is to include orientations so generally described, but not limited to such "up/down" definitions.

What is claimed is:

1. A system comprising:
   a pair of push-pull fans, the push-pull fans including an inlet fan and an exhaust fan; and
   a heat sink oriented between the push-pull fans, the heat sink composed of:
      a heat sink base that has a hot spot, the hot spot being hotter than other areas of the heat sink base; and
      a plurality of fins attached to the heat sink base, each of the fins having an air flow director on a side of said fin, wherein each of the single air flow directors directs a first portion of a flow of air from the inlet fan towards the hot spot of the heat sink base to provide direct cooling to the hot spot of the heat sink base, and wherein a second portion of the flow of air from the inlet fan impinges against the air flow directors to provide additional cooling to the fins.

2. The system of claim 1, wherein the air flow director is formed by stamping at least one slot in the side of the fin and using the stamped material as the air flow director.

3. The system of claim 1, wherein the air flow director is attached to an unstamped fin.

4. A heat sink comprising:
   a heat sink base that has a hot spot, the hot spot being hotter than other areas of the heat sink base; and
   a plurality of fins attached to the heat sink base, each of the fins having an air flow director on a side of said fin, wherein each of the single air flow directors directs a first portion of a flow of air from an inlet fan towards the hot spot of the heat sink base to provide direct cooling to the hot spot of the heat sink base, and wherein a second portion of the flow of air from the inlet fan impinges against the air flow directors to provide additional cooling to the fins.

5. The heat sink of claim 4, wherein the air flow director is formed by stamping at least one slot in the side of the fin and using the stamped material as the air flow director.

6. The heat sink of claim 4, wherein the air flow director is attached to an unstamped fin.

7. A method comprising:
   mounting a heat sink against a heat generating package between an inlet fan and an exhaust fan, the heat sink composed of:
      a heat sink base that has a hot spot, the hot spot being hotter than other areas of the heat sink base due to the heat generating package; and
      a plurality of fins attached to the heat sink base, each of the fins having an air flow director on a side of said fin, wherein each of the single air flow directors directs a first portion of a flow of air from the inlet fan towards the hot spot of the heat sink base to provide direct cooling to the hot spot of the heat sink base, and wherein a second portion of the flow of air from the inlet fan impinges against the air flow directors to provide additional cooling to the fins.

8. The method of claim 7, wherein the air flow director is formed by stamping at least one slot in the side of the fin and using the stamped material as the air flow director.

9. The method of claim 7, wherein the air flow director is attached to an unstamped fin.

* * * * *